(12) United States Patent
Oishi

(10) Patent No.: US 9,160,953 B2
(45) Date of Patent: Oct. 13, 2015

(54) SOLID STATE IMAGING DEVICE THAT INCLUDES A COLOR FILTER AND AN INTERLAYER DIELECTRIC LAYER ON OPPOSITE SIDES OF A SEMICONDUCTOR SUBSTRATE

(71) Applicant: Kabushiki Kaisha Toshiba, Tokyo (JP)

(72) Inventor: Amane Oishi, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 13/783,173

(22) Filed: Mar. 1, 2013

(65) Prior Publication Data
US 2014/0016012 A1  Jan. 16, 2014

(30) Foreign Application Priority Data
Jul. 13, 2012  (JP) .................................. 2012-157656

(51) Int. Cl.
| | |
|---|---|
| H04N 3/14 | (2006.01) |
| H04N 5/335 | (2011.01) |
| H04N 9/07 | (2006.01) |
| H04N 9/04 | (2006.01) |
| H04N 5/372 | (2011.01) |
| H01L 27/146 | (2006.01) |

(52) U.S. Cl.
CPC ............ *H04N 5/372* (2013.01); *H01L 27/1463* (2013.01); *H01L 27/1464* (2013.01); *H01L 27/14621* (2013.01); *H01L 27/14627* (2013.01); *H04N 9/045* (2013.01)

(58) Field of Classification Search
CPC .. H04N 5/375; H04N 9/045; H01L 27/14621; H01L 27/14627; H01L 27/1463; H01L 27/1464

USPC .................................. 348/294–310, 166–170
See application file for complete search history.

(56) References Cited

U.S. PATENT DOCUMENTS 7,709,969 B2 * 5/2010 Yamamoto et al. ........... 257/797
7,812,350 B2 * 10/2010 Kim ................................ 257/72
8,680,640 B2 * 3/2014 Mori et al. ..................... 257/440

(Continued)

FOREIGN PATENT DOCUMENTS

JP  2009065098 A  3/2009
JP  2010-161321 A  7/2010

(Continued)

OTHER PUBLICATIONS

Japanese Office Action dated Mar. 24, 2015, filed in Japanese counterpart Application No. 2012-157656, 6 pages (with translation).

*Primary Examiner* — Chia-Wei A Chen
(74) *Attorney, Agent, or Firm* — Patterson & Sheridan, LLP

(57) ABSTRACT

A solid state imaging device includes a semiconductor substrate having an element isolating layer and a plurality of photoelectric conversion elements each formed in a respective one of a plurality of pixel regions that are isolated from each other by the element isolating layer, an interlayer dielectric layer having wires formed on a first surface of the semiconductor substrate, and a color filter layer having pigmented films of a plurality of colors, formed on a second surface of the semiconductor substrate and in the pixel regions. The element isolating layer has a part projecting from the second surface, and at least part of the pigmented films is formed in a space defined by the second surface and the projecting part of the element isolating layer.

15 Claims, 12 Drawing Sheets

(56) References Cited

U.S. PATENT DOCUMENTS

| | | |
|---|---|---|
| 2005/0077588 A1 | 4/2005 | Kasuga |
| 2007/0194397 A1* | 8/2007 | Adkisson et al. ............. 257/432 |
| 2008/0179640 A1* | 7/2008 | Chuang et al. ................ 257/292 |
| 2008/0246853 A1* | 10/2008 | Takizawa et al. .......... 348/222.1 |
| 2008/0258248 A1* | 10/2008 | Kim .............................. 257/432 |
| 2008/0283883 A1 | 11/2008 | Shim |
| 2010/0006970 A1* | 1/2010 | Brady et al. ................. 257/447 |
| 2010/0176475 A1 | 7/2010 | Sano et al. |
| 2010/0201855 A1* | 8/2010 | Wada et al. ................... 348/294 |
| 2010/0207225 A1* | 8/2010 | Masuda ........................ 257/432 |
| 2011/0227185 A1 | 9/2011 | Yamaguchi |
| 2011/0278689 A1* | 11/2011 | Niisoe .......................... 257/432 |
| 2012/0187516 A1* | 7/2012 | Sato .............................. 257/443 |
| 2012/0199931 A1* | 8/2012 | Masuda ........................ 257/435 |
| 2012/0211851 A1* | 8/2012 | Mori et al. .................... 257/432 |
| 2012/0267741 A1* | 10/2012 | Suzuki et al. ................. 257/432 |

FOREIGN PATENT DOCUMENTS

| | | |
|---|---|---|
| JP | 2010258157 A | 11/2010 |
| JP | 4816768 | 9/2011 |

* cited by examiner

SOLID STATE IMAGING DEVICE THAT INCLUDES A COLOR FILTER AND AN INTERLAYER DIELECTRIC LAYER ON OPPOSITE SIDES OF A SEMICONDUCTOR SUBSTRATE

CROSS-REFERENCE TO RELATED APPLICATION

This application is based upon and claims the benefit of priority from Japanese Patent Application No. 2012-157656, filed Jul. 13, 2012; the entire contents of which are incorporated herein by reference.

FIELD

Embodiments described herein relate to a solid state imaging device.

BACKGROUND

Solid state imaging devices such as CCD image sensors and CMOS image sensors are used for various applications such as digital still cameras, video cameras, and surveillance cameras, etc. Single plate-type image sensors, which acquire information about multiple colors with a single pixel array, are becoming mainstream.

In recent years, development of backside illumination type image sensors, which take in light corresponding to an imaged object from the back side of the semiconductor device substrate, has been advancing.

DETAILED DESCRIPTION

The present disclosure is directed to improve the picture quality of images formed by image sensors.

In general, embodiments will be described in detail with reference to the figures. In the descriptions below, elements having the same functions and compositions will be given the same symbols, and redundant descriptions will be given when necessary.

A solid state imaging device according to an embodiment includes a semiconductor substrate having an element isolating layer and a plurality of photoelectric conversion elements each formed in a respective one of a plurality of pixel regions that are isolated from each other by the element isolating layer, an interlayer dielectric layer having wires formed on a first surface of the semiconductor substrate, and a color filter layer having pigmented films of a plurality of colors, formed on a second surface of the semiconductor substrate and in the pixel regions. The element isolating layer has a part projecting from the second surface, and at least part of the pigmented films is formed in a space defined by the second surface and the projecting part of the element isolating layer.

First Embodiment

The solid state imaging device according to a first embodiment and its manufacturing method will be described, with reference to FIG. 1 through FIG. 8.

(a) Structure

The structure of the solid state imaging device according to the first embodiment will be described using FIGS. 1 through 4.

Figure 1:
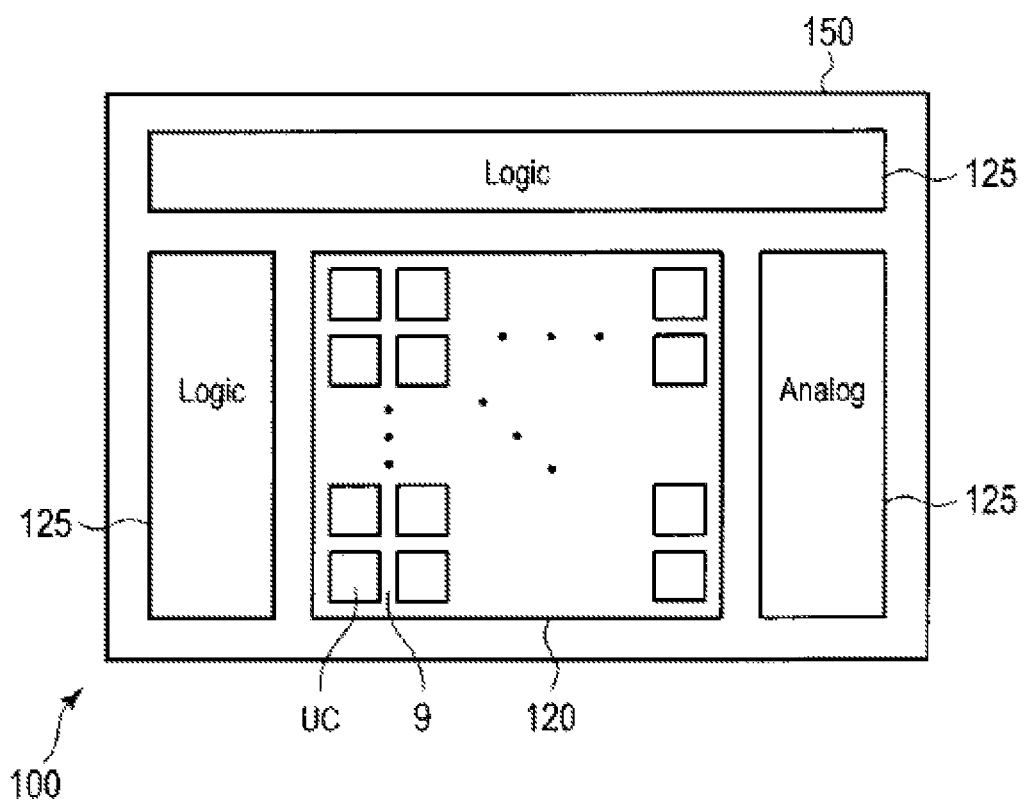
FIG. 1 is a planar view diagram showing one example of a layout of a chip of a solid state imaging device.
Figure 2:
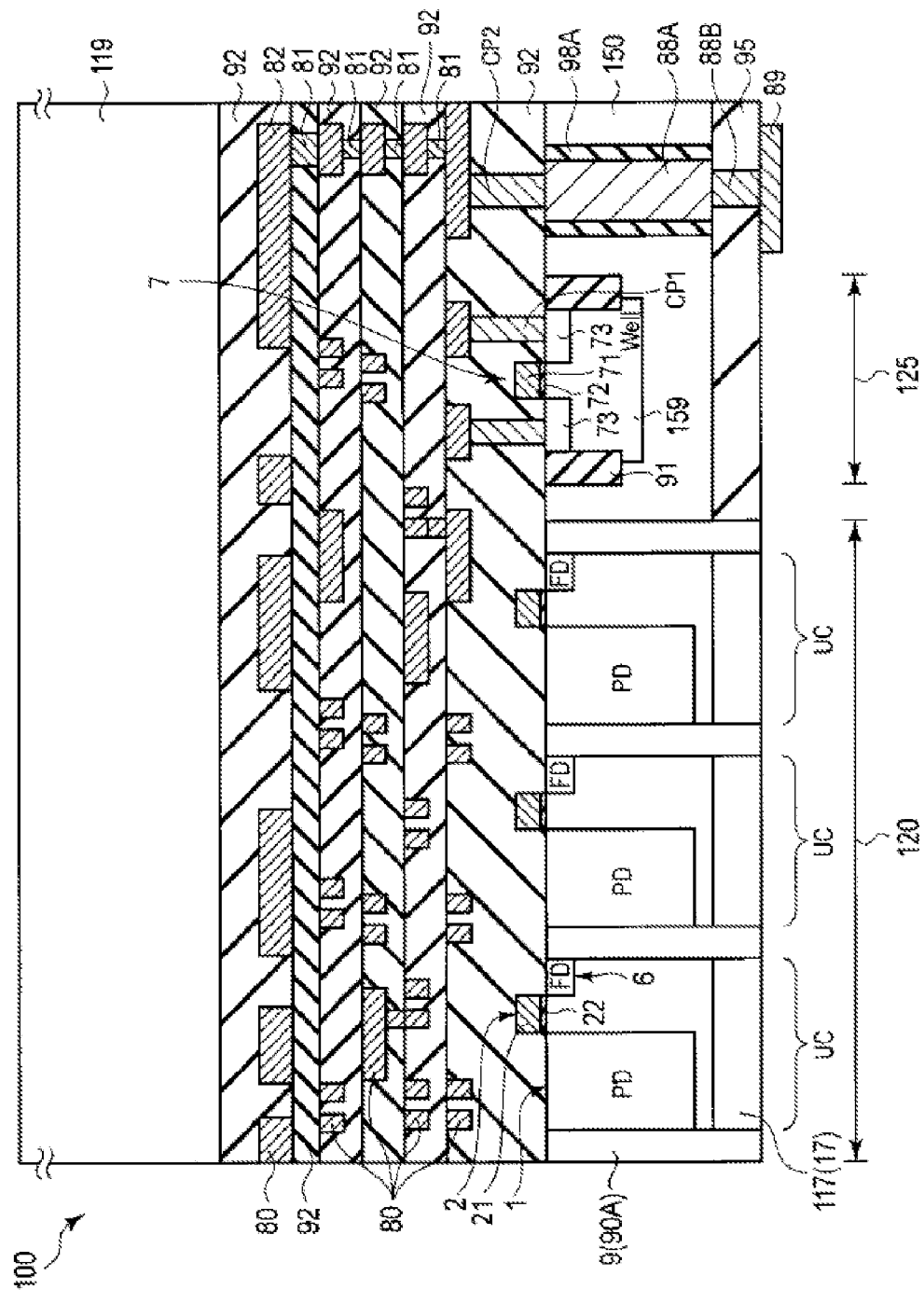
FIG. 2 is a cross-sectional diagram showing one example of the structure of a solid state imaging device.

FIG. 1 is a schematic diagram showing an example of a layout of a chip of a solid state imaging device according to the first embodiment. FIG. 2 is a cross-sectional schematic diagram showing one example of the structure of an image sensor according to this embodiment.

As shown in FIG. 1 and FIG. 2, in an image sensor 100 of the present embodiment, a pixel array 120 and a peripheral circuit region 125 that has an analog circuit or logic circuit for controlling the pixel array 120 are formed on one semiconductor substrate (chip) 150.

An Si monocrystalline substrate (bulk substrate) or an epitaxial layer of an SOI substrate is used for the semiconductor substrate 150.

The pixel array 120 includes a plurality of unit cells UCs. The unit cells (unit cell region UC) are arranged in a matrix form in the pixel array 120

Each unit cell UC includes a photoelectric conversion element to convert the light corresponding to the subject (outside light) to electric signals. Each unit cell UC includes at least one photoelectric conversion element. Each photoelectric conversion element corresponds to a pixel. The region in which the pixel is formed inside the unit cell region is called a pixel region. Thus, each pixel region includes one photoelectric conversion element.

An element isolating region is formed between adjacent unit cells UC, (i.e., between adjacent pixel regions, and adjacent photoelectric conversion elements). Thus, each pixel region (i.e., each unit cell UC and each photoelectric conversion element) is surrounded by the element isolating region 9.

A photoelectric conversion element 1 is formed, for example, by a photodiode. As shown in FIG. 2, the photodiode 1 is formed using at least one dopant layer 10 (shown in FIG. 4) in the semiconductor substrate 150. The photodiode 1 conducts photoelectric conversion of the light from a subject to an electric signal (charge, voltage) according to the light intensity. The photodiode 1 can accumulate charge generated in the dopant layer 10.

A floating diffusion layer or node 6, which is formed as a dopant layer 60 (shown in FIG. 4), is arranged within the semiconductor substrate 150. The floating diffusion layer 6 functions to temporarily store charge output from the photodiode 1 via a field effect transistor 2.

The field effect transistor 2 is formed on the semiconductor substrate 150 between the photodiode 1 and the floating diffusion node 6. A gate electrode 21 of the field effect transistor 2 is formed on the channel region in the semiconductor substrate 150, and a gate insulating film 22 is sandwiched between the gate electrode 21 and the channel region.

The plurality of unit cells UCs (pixels) constitutes a image sensor. The unit cell UC can include other compositional elements in addition to the photodiode 1, the floating diffusion node 6, and the transfer gate 2, depending on the circuit configuration of the image sensor. For example, the unit cell UC may include field effect transistors, such as amplifier transistors or reset transistors, for its compositional elements.

Figure 3:
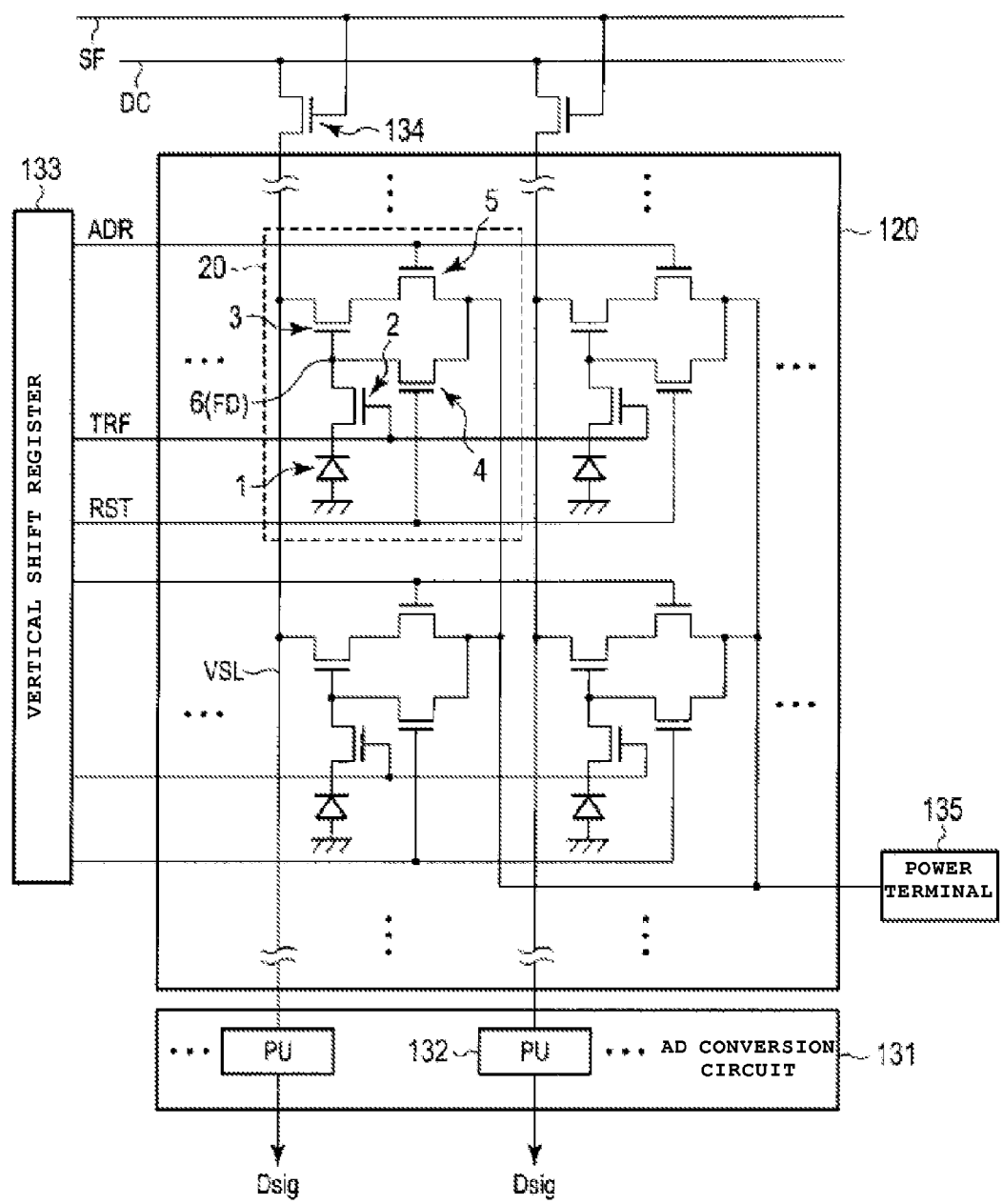
FIG. 3 is an equivalent circuit schematic showing the one example of a circuit configuration of a pixel array and the neighborhood of the pixel array.

FIG. 3 shows an example of a circuit configuration of the pixel array 120 and its neighboring circuits.

The unit cells UCs are arranged in the pixel array 120 in a matrix form, and each unit cell UC is formed at the intersection of a read control line TRF and a vertical signal line VSL.

The unit cells UC arranged in the row direction of the pixel array 120 are connected to a common read control line TRF. The unit cells UC arranged in the column direction of the pixel array 120 are connected to a common vertical signal line VSL.

For example, each unit cell UC, in order to control the behavior of the unit cells UC and the photodiode 1, may include four field effect transistors 2, 3, 4, and 5. In the example shown in FIG. 3, the four field effect transistors 2, 3, 4, and 5 included in the unit cells UC are a transfer gate (read transistor) 2, amplifier transistor 3, a reset transistor 4, and an address transistor 5. Each of the field effect transistors 2, 3, 4, and 5 may be, for example, an N-channel type MOS transistor.

Each element 1, 2, 3, 4, and 5 in the unit cells UC is connected as follows.

The anode of the photodiode 1 is, for example, grounded. The cathode of the photodiode 1 is connected to the floating diffusion node 6 via a current path of the transfer gate 2.

The transfer gate 2 controls accumulation and transfer of the signal charge that has been photoelectrically converted by the photodiode 1. The gate of the transfer gate 2 is connected to the read control line TRF. One end of the current path of the transfer gate 2 is connected to the cathode of the photodiode 1, and the other end of the current path of the transfer gate 2 is connected to the floating diffusion node 6.

The amplifier transistor 3 detects and amplifies the signal (potential) of the floating diffusion node 6. The gate of the amplifier transistor 3 is connected to the floating diffusion node 6. One end of the current path of the amplifier transistor 3 is connected to the vertical signal line VSL and the other end of the current path of the amplifier transistor 3 is connected to one end of the current path of the address transistor 5. The signal amplified by the amplifier transistor 3 is output to the vertical signal line VSL. The amplifier transistor 3 functions as a source follower.

The reset transistor 4 resets the potential (the retention state of the signal charge) of the floating diffusion node 6. The gate of the reset transistor 4 is connected to the reset control line RST. One end of the current path of the reset transistor 4 is connected to the floating diffusion node 6, and the other end of the current path of the reset transistor 4 is connected to a supply terminal 135.

The address transistor 5 controls the activation of the unit cells UC. The gate of the address transistor 5 is connected to an address control line ADR. One end of the current path of the address transistor 5 is connected to the other end of the amplifier transistor 3, and the other end of the current path of the address transistor 5 is connected to the supply terminal 135.

The supply terminal 135 is connected to a drain power source, a ground power source, or an optical black region in the unit cell (reference potential cell).

In the present embodiment, the configuration in which one unit cell UC has one photodiode 1 forming one pixel is called the one-pixel one-cell structure.

A vertical shift register 133 is connected to the read control line TRF, the address control line ADR, and the reset control line RST. The vertical shift register 133 controls the potential of the read control line TRF, the address control line ADR, and the reset control line RST, and also controls and selects the unit cells UCs and the pixels in the pixel array 120 by row. The vertical shift register 133 outputs a control signal (voltage pulse) that controls ON and OFF of each transistor 2, 4, and 5, to each control line TRF, ADR, and RST.

An AD conversion circuit 131 is connected to the vertical signal line VSL. The AD conversion circuit 131 includes processing units (PUs) 132 to convert the analog signals from the unit cells UCs to digital signals as well as to perform CDS (Corrected Double Sampling) processing of the signals from the unit cells UCs.

A load transistor 134 is used for the current source for the vertical signal line VSL. The gate of the load transistor 134 is connected to a select line SF. One end of the current path of the load transistor 134 is connected to one end of the current path of the amplifier transistor 3, via the vertical signal line VSL. The other end of the current path of the load transistor 134 is connected to a control line DC.

In addition, each unit cell UC does not have to include the address transistor 5. In this case, in the unit cell UC, the other end of the current path of the reset transistor 4 is connected to the other end of the current path of the amplifier transistor 3. If the unit cell UC does not include the address transistor 5, it does not have the address signal line ADR either.

The unit cell UC can have a circuit configuration in which one unit cell includes two or more pixels (photodiodes), such as two-pixel one-cell structure, four-pixel one-cell structure, or eight-pixel one-cell structure (multi-pixel one-cell structure). In a unit cell including multiple pixels, two or more photodiodes share one floating diffusion node 6, the reset transistor 4, amplifier transistor 3, and the address transistor 5. In a unit cell including multiple pixels, one transfer gate 2 is formed for each one photodiode. If a unit cell is formed from one pixel, the unit cell includes one pixel region. If a unit cell is formed of multiple pixels, the unit cell includes multiple pixel regions. In a unit cell with a multi-pixel one-cell structure, the multi-pixel regions are isolated from each other by element-isolating region.

As shown in FIGS. 1 and 2, the peripheral circuit region 125 is formed in the semiconductor substrate 150 so that it is adjacent to the pixel array 120, while the element isolating region 9 is formed between the semiconductor substrate 150 and the pixel array 120.

Both a circuit controlling the behavior of the pixel array 120, like the vertical shift register 133, and a circuit processing signals from the pixel array 120, like the AD conversion circuit 131 are formed at the peripheral circuit region 125.

The peripheral circuit region 125 is electrically isolated from the pixel array 120 by the element isolating region 9. Within the element isolating region for partitioning the peripheral circuit region 125, an element isolating insulation film 91 with, for example, an STI structure is embedded.

The circuit inside the peripheral circuit region 125 is formed from multiple electric elements such as a field effect transistor 7, a resistor element, and a capacitor element, etc. In FIG. 2, to simplify the diagram, only the field effect transistor 7 is shown. In FIG. 2, while only one field effect transistor is shown, multiple transistors are formed to constitute the peripheral circuit on the semiconductor substrate 150.

For example, within the peripheral circuit region 125, the field effect transistor (for example, a MOS transistor) 7, may be formed in a well region 159 in the semiconductor substrate 150. Two diffusion layers (dopant layers) 73 are formed in the well region 159. These two diffusion layers 73 function as the source and drain of the transistor 7. A gate electrode 71 is formed on the surface of the well region (channel region) 159, between two diffusion layers 73, while a gate insulating film 72 is formed between the gate electrode and the surface of the well region. Due to this configuration, a field effect transistor 7 is formed in the well region 159.

In addition, whether the field effect transistor 7 is a P-channel type or an N-channel type is determined by the conductivity type of the well region 159 and the conductivity type of the diffusion layer 73.

A plurality of interlayer dielectric films 92 are laminated on the semiconductor substrate 150 so as to cover the upper surface of the gate electrodes 21 and 71 as well as the photodiode 1. For the interlayer dielectric film 92, for example, silicon oxide may be used.

A multilayer interconnection technology is used in the image sensor 100 of the first embodiment. Thus, inside the laminated interlayer dielectric film 92 multiple wires 80 are formed on each layer level (i.e., the height from the substrate surface). Each wire 80 is electrically connected to other wires positioned at differing layer levels, by plugs 81, CP1, and CP2 that are each embedded inside the interlayer dielectric film 92. Further, the wires 80 include dummy layers (for example, light shielding film) that are not connected to the elements or the circuits.

The gate electrodes 21 and 71, the source/drain 73 of the transistors 2 and 7, and the terminals of the elements formed on the semiconductor substrate 150, are connected to the wires 80 via the contact plugs CP1 and CP2 in the interlayer dielectric film 92. The wires 80 of the lower layers and the wires 80 of the upper layers connect multiple elements installed on the semiconductor substrate 150, via the via-plugs 81 embedded in the interlayer dielectric film 92. Thus, the multiple circuits inside the image sensor are formed by multilayer interconnection technology.

In the present embodiment, the surface on which the elements are formed, more specifically the surface of the semiconductor substrate 150 on which the gate electrodes 21 and 71 are formed, is determined to be a front surface of the semiconductor substrate 150 (first surface). The interlayer dielectric film 92 and the wires 80 are formed on the front surface of the semiconductor substrate 150 by multilayer interconnection technology. On the other hand, the surface opposing the front surface of the semiconductor substrate 150 in the direction perpendicular to the surface of the semiconductor substrate 150 (the surface on the other side of the front surface) is determined to be a rear surface (second surface). In the present embodiment, if the front surface and the rear surface of the semiconductor substrate 150 are indistinguishable, the both surfaces of the semiconductor substrate 150 are determined to be principle surfaces of the semiconductor substrate 150.

A via (called through-hole via or through-hole electrodes below) 88A is formed in the semiconductor substrate 150, so that it penetrates the semiconductor substrate 150 from the front surface to the rear surface of the semiconductor substrate 150. The through hole via 88A is embedded within the through-hole (opening section) formed in the semiconductor substrate 150. An insulating layer 98A is formed on the inner surface of the through-hole to electrically isolate through-hole via 88A from the semiconductor substrate 150.

The through-hole via 88A is connected to the wires 80 in the interlayer dielectric film 92 via the contact plug CP2. The through-hole via 88A is connected to a pad (electrode) formed below the rear surface of the semiconductor substrate 150 via a via plug 88B. The pad 89 is formed on the insulating layer (planarizing layer or protective film) 95 below the rear surface of the semiconductor substrate 150. The pad 89 is electrically isolated from the semiconductor substrate 150 by the insulating layer 95.

In the present embodiment, as shown in FIG. 2, on the rear surface of the semiconductor substrate 150, for example, a color filter 117 is installed, while a protective layer (not shown in the diagram) or an adhesive layer (not shown in the diagram) is formed between the rear surface and the color filter 117. The color filter 117 is formed in a position corresponding to the pixel array 120 on the rear surface of the semiconductor substrate 150. For example, the image sensor 100 of the present embodiment may be a single plate-type image sensor 100. A single plate-type image sensor acquires information about multiple colors with a single pixel array 120. Because of this, the color filter 117 used for a single plate-type image sensor has multiple pigmented coatings corresponding to the multiple colors (color information) included in the light from the subject.

In the image sensor 100 of the present embodiment, the color filter 117 is formed on the surface (the rear surface) of the semiconductor substrate 150 opposite the surface (the front surface) on which the gate electrodes 21 and 71 and the interlayer dielectric film 92 are formed.

The light from the subject is incident onto the pixel array 120 from the rear surface of the semiconductor substrate 150, through the color filter 117, and is taken in by the photodiode 1.

A support substrate 119 is formed on the interlayer dielectric film 92. The support substrate 119 may be laminated on the interlayer dielectric film 92, while a protective layer (not shown in the diagram) and an adhesion layer (not shown in the diagram), for example, are formed between the interlayer dielectric film 92 and the support substrate 119. For the support substrate 119, for example, silicon substrates and insulating substrates are used. The semiconductor substrate 150 on which the elements are formed is sandwiched between the support substrate 119 and the color filter 117.

In the present embodiment, the rear surface of the semiconductor substrate 150 on which the color filter 117 is formed serves as the surface that receives light from the subject. Like the image sensor 100 of the present embodiment, an image sensor having a structure in which the light is incident onto the photodiode 1 from the rear surface the semiconductor substrate 150 is called a backside-illumination-type image sensor.

Figure 4:
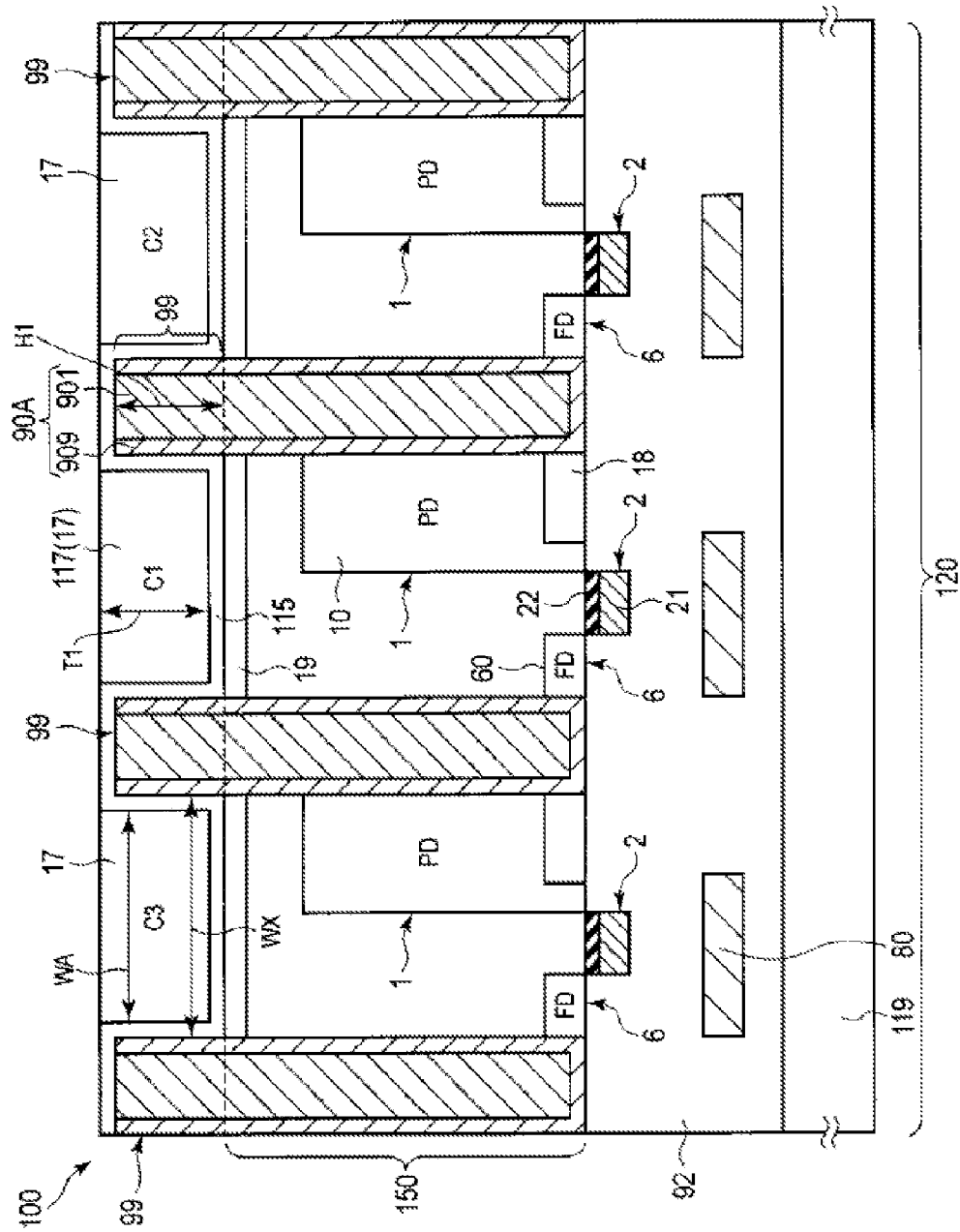
FIG. 4 is a cross-sectional diagram showing one example of the structure of the solid state imaging device according to a first embodiment.

FIG. 4 shows one example of a cross-sectional structure of the pixel array 120 of the backside-illumination-type image sensor 100 according to the present embodiment.

In FIG. 4, to clarify the diagrammatic representation of the compositional element of the unit cell UC, only the photodiode 1, the transfer gate 2, and the floating diffusion node 6 are shown. In the unit cell region, the region in which the photodiode 1, transfer gate 2, and the floating diffusion node 6 are formed is the pixel region. In FIG. 4, the interlayer dielectric film, wires, and the support substrate on the front surface of the semiconductor substrate 150 are shown simplified.

As shown in FIG. 4, the photodiode 1, transfer gate 2, and the floating diffusion node 6, are formed in an element-forming region (active region) partitioned by the element isolation layer 90A.

In the case that the dopant layer of the photodiode 1 is formed in a P-type semiconductor substrate (semiconductor layer) 150, the dopant layer of the photodiode 1 is of an N-type dopant layer 10.

In FIG. 4, to simplify the diagrammatic representation, only one N-type dopant layer 10 is shown as the compositional element of the photodiode 1. However, in order to improve the characteristics (for example sensitivity and incident photon-to-current conversion efficiency) of the photodiode 1, a plurality of N-type and P-type dopant layers with differing dopant concentrations can be formed in the forming region (called the photodiode forming region) of the photodiode 1 in the direction of the depth of the semiconductor substrate 150.

The floating diffusion node 6 is formed in the semiconductor substrate 150 and physically isolated from the photodiode 1. The transfer gate 1 is formed on the semiconductor substrate 150 and between the photodiode 1 and the floating diffusion node 6. The photodiode 1 and the floating diffusion node 6 are arranged along the length direction of the channel of the transfer gate 2.

The floating diffusion node 6 is an N-type dopant layer 60 that is formed in the semiconductor substrate 150. For example, the concentration of the N-type dopant layer 60 may be higher than the dopant concentration of the N-type dopant layer 10.

The gate electrode 21 of the transfer gate 2 is formed on the semiconductor substrate 150, while the gate insulating film 22 is formed between the gate electrode 21 and the semiconductor substrate 150. The N-type dopant layer 10 as the compositional element of the photodiode 1 and the N-type dopant layer 60 of the floating diffusion node 6 function as the source and the drain of the transfer gate 2, respectively. In the semiconductor substrate 150, the semiconductor region between two N-type dopant layers 10 and 60 act as the channel region of the transfer gate 2.

At the rear surface of the semiconductor substrate 150, a front surface shield layer 18 is formed in the N-type dopant layer 10 of the photodiode 1. The front surface shield layer 18 may be, for example, a P-type dopant layer. The front surface shield layer 18 is formed so that it is apart from the channel region of the transfer gate 2. The surface of the front surface shield layer 18 is in contact with the interlayer dielectric film 92.

At the rear surface of the semiconductor substrate 150, a rear surface shield layer 19 is formed in the semiconductor substrate 150. The rear surface shield layer 19 may be in contact with the N-type dopant layer 10. The rear surface shield layer 19 is, for example, a P-type dopant layer.

A dark current generated in the photodiode 1 can be suppressed with the front surface/rear surface shield layers 18 and 19.

In the image sensor 100 of the present embodiment, an element isolating layer 90A in the pixel array 120 is formed in a trench (groove, opening part, or through hole) that is formed in the semiconductor substrate 150. The element isolating layer 90A has a DTI (Deep Trench Isolation) structure and penetrates between the front surface and the rear surface of the semiconductor substrate 150. For example, on the front surface of the semiconductor substrate 150, the end part of the element isolating layer 90A is in contact with the interlayer dielectric film 92.

The element isolating layer 90A, in the unit cell region and the pixel region, surrounds the periphery of at least the photodiode.

The element isolating layer 90A, for example, has a laminate structure, and includes a first part 901 and a second part 909 that covers the bottom side and the lateral side of the first part 901. Thus, the second part 909 is formed between the lateral side of the first part 901 and the semiconductor substrate 150, as well as between the bottom side of the first part 901 and the interlayer dielectric film 92.

The second part 909 is formed along the lateral surface and bottom surface of the trench formed in the semiconductor substrate. To simplify the description, the first part 901 is called the embedded part and the second part 909 is called the side wall part, hereinafter.

In the element isolating layer 90A with a laminate structure, the embedded part 901 is made of, for example, metals (conductive material) such as tungsten, and the side wall part 909 is made of, for example, titanium, nitride. When used for the side wall part 909, titanium nitride functions as a barrier metal. If the element isolating layer 90A includes a conductive material, a certain voltage (0V, a positive, or negative fixed voltage) can be, but does not have to be, applied to the element isolating layer 90A, depending on the characteristics of the image sensor.

To simplify the description, in the element isolating layer 90A with a DTI structure, the side of the element isolating layer 90A facing the front surface (interlayer dielectric film) of the semiconductor substrate 150 is called a lower end or a bottom part of the element isolating layer 90A, hereinafter. Also, the side of the element isolating layer 90A facing the rear surface side of the semiconductor substrate 150 is called the upper end or the upper part of the element isolating layer 90B, hereinafter.

In addition, the bottom part (lower end) of the element isolating layer 90A need not be in contact with the interlayer dielectric film 92, and another material (e.g., impurity dopant layer or an insulating body) can be formed between the bottom part of the element isolating layer 90A and the interlayer dielectric film 92. Also, the bottom part of the element isolating layer 90A can project out from the front surface of the semiconductor substrate 150, and be embedded in the trench formed in the interlayer dielectric film 92.

In the image sensor 100 of the present embodiment, an upper part of the element isolating layer 90 projects out from the rear surface of the semiconductor substrate 150 in a direction perpendicular to the principle surface of the semiconductor substrate 150. The upper part of the element isolating layer 90A projecting out from the rear surface of the semiconductor substrate 150 in the direction perpendicular to the principle surface of the semiconductor substrate 150 will be called a projecting part 99.

The height of the element isolating layer 90A in the direction perpendicular to the principle surface of the semiconductor substrate is larger than the depth of the trench formed in the semiconductor substrate 150. Thus, the height of the element isolating layer 90A is larger than the thickness of the semiconductor substrate 150.

In the image sensor 100 of the present embodiment, the color filter 117 is formed within the element isolating layer 90A projecting out from the semiconductor substrate 150. In the present embodiment, each pigmented film 17 included in the color filter 117 is divided by the projecting part 99 of the element isolating layer 90A so that each pigment film 17 corresponds to each photodiode 1. Thus, the element isolating layer 90A is formed between adjacent pigment films 17.

In a single plate-type image sensor, the color filter 117, may include, for example, a red, blue, and green pigmented films 17. With each pigmented film 17, a pigmented film of one color is formed in the color filter 117 so that it corresponds to one photodiode 1. The pigmented films 17 for each color C1, C2, and C3 may be arranged in the color filter 117 so that the layout is a Bayer pattern layout. The color filter 117 can have, in addition to red, green and blue, yellow and white filters as well.

A pigmented film 17 having a color (e.g., C1) is adjacent to a pigment film 17 having a different color (e.g., C2 or C3) The colors of two pigment films 17 that is adjacent to a pigment film having a color (e.g., C1) may be different (e.g., C2 and C3) or may be the same (e.g., C2 and C2), depending on the arrangement pattern of the color filter 117.

The pigmented film 17 may be an organic film formed by the coating method (spin coat), etc., or can be an inorganic film formed by the CVD method, etc.

An antireflective film 115 is formed between the pigmented film 17 and the semiconductor substrate 150. The antireflective film 115 is permeable to visible light.

The antireflective film 115 is also formed between the pigmented film 17 and the lateral side (the side surface of the projecting part 99) of the element isolating layer 90A. Also, the antireflective film 115 is formed on the upper end of the element isolating layer 90A. Thus, the antireflective film 115 covers the projecting part 99 of the element isolating layer 90A.

If the antireflective film 115 has a uniform film thickness, or if the film thickness of the antireflective film 115 is negligible, dimensions (film thickness) of the pigmented film 17 T1 in the direction perpendicular to the principle surface of the semiconductor substrate 150 is the substantially same as dimensions (height) H1 of the projecting part of the element isolating layer 90A in the direction perpendicular to the principle surface of the semiconductor substrate 150.

The dimensions WA (the width or the length) of the pigmented film 17 in the direction parallel to the principle surface of the semiconductor substrate 150, is smaller than a distance WX between the adjacent projecting parts 99 in a direction parallel to the principle surface of the semiconductor substrate 150. This is because the antireflective film 115 is formed on the side surface of the projecting part 99. For example, the dimension WA of the pigmented film 17 is smaller than the distance WX between the projecting parts 99 by twice the film thickness of the antireflective film 115.

Here, the dimension H1 of the projecting part 99 in the direction perpendicular to the principle surface of the semiconductor substrate 150 is the dimension from the position on the rear surface of the semiconductor substrate 150 to the upper end of the projecting part 99 (element isolating layer).

The surface (upper surface) of each pigmented film 17 (light incident side) can be set back to the side of the semiconductor substrate 150. In this case, the thickness T1 of each pigmented film 17 is smaller than the dimension H1 of the projecting part 99. The thickness T1 of each pigmented film 17 can be different by color.

In a normal single-panel-type image sensor, a color filter including a plurality of pigmented films is formed at the pixel array. The pigmented films for plurality of colors are formed in an array within the color filter so that the pigmented film of a color corresponds to one photodiode.

If an alignment shift between the pigmented film and the photodiode is caused by a manufacturing process of the solid state imaging device, two pigmented films with different colors may be formed (overlap) above the photodiode. Also, as a result of the alignment shift of the color filter, a solid imaging device may have both a region in which a pigmented film is formed above the photodiode and a region in which a pigmented film is not formed above the photodiode.

The alignment shift of the pigmented film of the color filter and the photodiode may occur, not only to a pair of pigmented film and its corresponding photodiode, but also to many pairs of the pigmented film and the photodiode that are formed as an array in the pixel array.

As a result of this alignment shift between the pigmented film and the photodiode, an optical crosstalk (color mixture) occurs in a certain region of a certain photodiode or pixel array.

To solve this problem, according to the manufacturing method of the image sensor 100 of the present embodiment and the image sensor mentioned below, each pigmented film 17 included in the color filter 117 is formed in a self-aligning fashion, in the depressed part (trench) formed by the projecting part 99 of the element isolating layer 90A and the rear surface of the semiconductor substrate 150.

Due to the configuration, each pigmented film 17 is formed so that it fits into the unit cell region/pixel region partitioned by the element isolating layer 90A. Thus, an alignment shift between the photodiode 1 as the photoelectric conversion element and the pigmented film 17 can be prevented.

According to the present embodiment, by preventing an alignment shift of the pigmented film and the photodiode, adverse effects on the crosstalk of the image sensor can be reduced and color mixture in the generated image can be suppressed.

Also, like the present embodiment, if the solid state imaging device has a structure that, in effect, is not likely to cause an alignment shift of the photodiode 1 and the pigmented film 17, a micro-lens corresponding to each photodiode 1 may not necessarily be formed on the color filter 117.

If micro-lenses are not formed, variability in the characteristics and the output of the photodiode in the pixel array resulting from alignment shifts of the micro-lens and the photodiode 1 or variability in the shapes and characteristics of the micro-lenses can be reduced. As a result, in the present embodiment, degradation in the image that can be caused by the micro-lens can be suppressed.

Therefore, the quality of the image formed by the image sensor can be improved according to the image sensor of the present embodiment.

(b) The manufacturing method of the solid state imaging device (for example, an image sensor) of the first embodiment is described below using FIGS. 5 to 8.

FIGS. 5 to 8 show cross-sectional process diagrams of the pixel array 120 in each process of the manufacturing method of the image sensor of the present embodiment. Here, in addition to FIGS. 5 to 8, FIGS. 2 and 4 will be used to describe each process of the manufacturing method of the image sensor of the present embodiment.

In addition, in the manufacturing method of the image sensor of the present embodiment, the order of forming each element, can be changed if the consistency of the process is preserved.

As shown in FIG. 2, using a mask (not shown in the figure) formed by photolithography and RIE (Reactive Ion Etching), the element isolating region and the element isolating layer 91 are formed in a predetermined region (for example, the peripheral circuit region) in the semiconductor substrate 150.

For example, as shown in FIG. 2, an element isolating trench with a Shallow Trench Isolation (STI) structure is formed in the semiconductor substrate 150 using a mask, and an insulating material is embedded in the element isolating trench by the Chemical Vapor Deposition (CVD) method or the coating method. By this process, the element isolating film 91 with an STI structure is formed in a predetermined position in the semiconductor substrate 150.

By the element isolating film 91, the pixel array 120, the unit cell region UC in the pixel array 120, and the peripheral circuit region 125 are partitioned in the semiconductor substrate 150.

Using a mask different from the mask forming the element isolating film 91, the N-type or P-type well region 159 is formed in a predetermined region in the semiconductor substrate 150.

Figure 5:
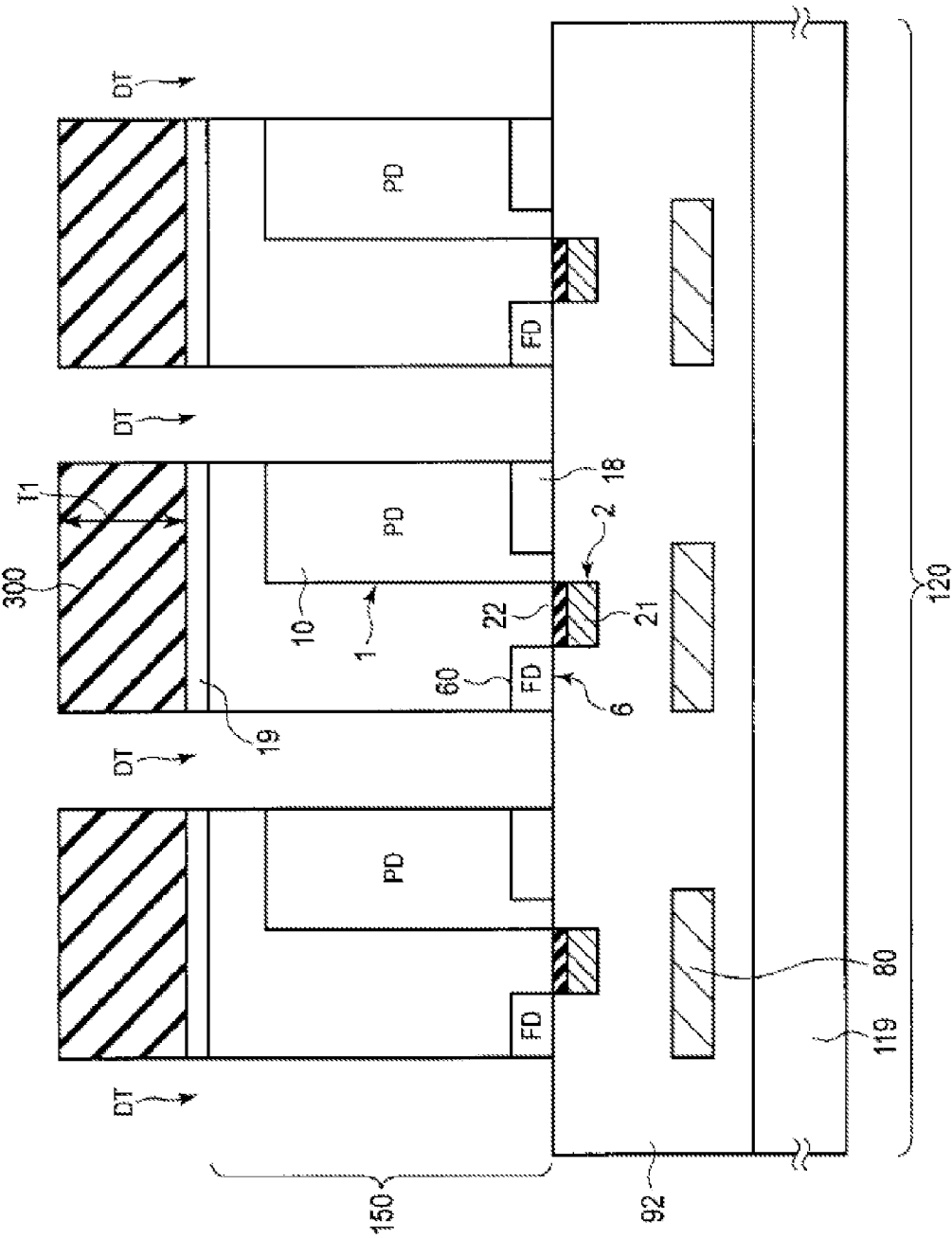
FIG. 5 shows one process of a method of manufacturing the solid state imaging device according to the first embodiment.

As shown in FIGS. 2 and 5, the elements of the unit cell (pixel) are formed in the unit cell region UC of the pixel array 120. Also, as shown in FIG. 2, the elements (for example, a transistor) of the peripheral circuit are formed in the well region 159 of the peripheral circuit region 125.

The gate insulating films 22 of the transistors 2 and the gate insulating films 72 of the transistors 7 may be, for example, formed on an exposed surface (front surface) of the semiconductor substrate 150 by a thermal oxidation process on the semiconductor substrate 150.

A polysilicon layer is deposited by the CVD method on the gate insulating films 22 and 72. The polysilicon layer is patterned by the photolithography and RIE method to constitute the gate electrodes 21 and 71 on the gate insulating films 22 and 72, respectively. The gate electrodes 21 and 71 have a predetermined gate length and a predetermined gate width and are formed above the front surface (first surface) of the semiconductor substrate 150.

As shown in FIGS. 2 and 5, in the pixel array 120, the gate electrode 22 and the resist film (not shown in the diagrams) are used as a mask, and the N-type dopant layer 10s of the photodiodes 1 are formed in photodiode forming regions in the unit cell regions UCs by the ion implantation method.

In floating diffusion forming regions of the unit cell regions UCs, the floating diffusion nodes 6 in the form of dopant layer 60, are formed in the semiconductor substrate 150 by ion implantation.

Also, dopant layers (not shown in the figure) such as the source/drain of each of the transistors in the pixel array 120, such as the amplifier transistors, are each formed by ion implantation.

By performing ion implantation at the exposed surface of the N-type dopant layer 10 of the photodiode 1, the P-type dopant layer as the front surface shield layer 18 is formed in the N-type dopant layer 10.

For example, in the pixel array 120, while ion implantation is being executed to form the photodiode 1 and the floating diffusion node 6, the peripheral circuit region 125 is covered by the resist film (not shown in the figure).

In the region (N-type or P-type well region) 159 in which the transistor 7 in the peripheral circuit region 125 shown in FIG. 2 is formed, the P-type or N-type dopant layers 73 as the source/drain of the transistor 7 are formed in semiconductor substrate 150 by ion implantation using the gate electrode 72 as a mask. In addition, the transistor 7 in the peripheral circuit region 125 can be formed by the formation process of the transistor in the pixel array 120.

As shown in FIGS. 2 and 5, a multilayer interconnection structure including a plurality of interlayer dielectric films 92 and a plurality of wires 80 is formed by multilayer interconnection technology on the front surface of the semiconductor substrate 150 on which the gate electrode 21 of the transistor 2 is formed. The interlayer dielectric film 92 covers the front surface of the semiconductor substrate 150 and, for example, may cover the gate electrodes 21 of the transistors 2.

During the formation process of each interconnection level of the multilayer interconnection structure, as shown in FIG. 2, for example, an interlayer dielectric film 92 of a silicon oxide film is deposited using the CVD method. In each interconnection level, after a planarization process by the CMP method is conducted on the interlayer dielectric film 92, as shown in FIG. 2, the contact plug CP1 or the via-plug 81 is embedded in the contact hole formed by photolithography and the RIE method in the interlayer dielectric film 92.

For example, a conductive layer including aluminum and copper as the main constituents may be deposited on the interlayer dielectric film 92 and the plugs CP1 and 81 by the sputtering method. The deposited conductive layer is fabricated into a predetermined shape, so that it connects with the plugs CP1 and 81, by photolithography and the RIE method. By this process, the conductive layer 80 is formed into wires. During formation of the conductive layer 80 as wires, a light shielding film and a dummy layer made from the same material are also formed on the interlayer dielectric film 92. Using the damascene method, wires made of copper or copper alloy can be formed in a self-aligning fashion in the trench (damascene trench) formed in the interlayer dielectric film.

By the processed described above, multiple elements 1, 2, and 7 on the semiconductor substrate 150 are connected by wiring according to multilayer interconnection technology, and form each circuit of the image sensor.

As shown in FIGS. 2 and 5, after a planarizing process is conducted on the interlayer dielectric film 92 (and the conductive layer) on the upper-most layer on the front surface side of the semiconductor substrate 150, an adhesive layer (not shown in the figure) is formed on the planarized surface of the interlayer dielectric film 92 on the upper-most layer. The support substrate 119 is adhered to the adhesive layer on the interlayer dielectric film 92. By this process, the support substrate 119 is joined to the interlayer dielectric film 92 covering the front surface of the semiconductor substrate.

For example, before the support substrate 119 is adhered to the interlayer dielectric film 92, wires to modify the wirings in the interlayer dielectric films 92 can be formed on the upper-most interlayer dielectric film 92 so that the wires are connected to the wires in the interlayer dielectric film 92.

After the support substrate 119 is adhered to the interlayer dielectric film 92, the rear surface of the semiconductor substrate 150 is selectively etched using the CMP method, or wet etching using HF solutions. By this process, the thickness of the semiconductor substrate 150 is reduced.

As shown in FIG. 5, after the semiconductor substrate 150 is thinned, on the rear surface side of the semiconductor substrate 150, a P-type dopant layer 19 as the rear surface shield layer 19 is formed inside the semiconductor substrate 150 in the pixel array 120 by ion implantation.

On the rear surface of the semiconductor substrate 150, a hard mask 300 is formed using, for example, the CVD method. The hard mask 300 is patterned by photolithography. Openings are formed in the hard mask 300 so that the openings corresponding to the position of the element isolating region 9 in the pixel array 120. The thickness of the hard mask 300 is adjusted based on the thickness of the pigmented film of the color filter. For example, the thickness of the hard mask may be set within the range of around 0.2 μm to around 0.8 μm.

Based on the patterned hard mask 300, the semiconductor substrate 150 may be etched by, for example, RIE. By this etching, a trench DT is formed in the semiconductor substrate 150 in the element isolating region 9 of the pixel array 120. For example, the trench DT may be formed so that it has a depth (the dimension perpendicular to the principle surface of the semiconductor substrate) of around 1.5 μm to 3 μm, according to the thickness of the thinned semiconductor substrate 150. The trench DT, for example, penetrates from the rear surface to the front surface of the semiconductor substrate 150, and via the trench DT, the surface of the interlayer dielectric film 92 on the side surface (interior surface) of the semiconductor substrate 150 and the semiconductor substrate 150 side is exposed.

There are cases in which, during the etching process of the semiconductor substrate 150, the interlayer dielectric film 92 is also etched, and depressions (trenches) are formed in the interlayer dielectric film 92 in the position of the trench DTs. TO the contrary, there are cases in which the interlayer dielectric film 92 is not exposed in the formation positions of the trench DTs. Also, there are cases in which the cross-sectional shapes of the trench DTs are tapered, depending on the depth of the trench DTs.

Figure 6:
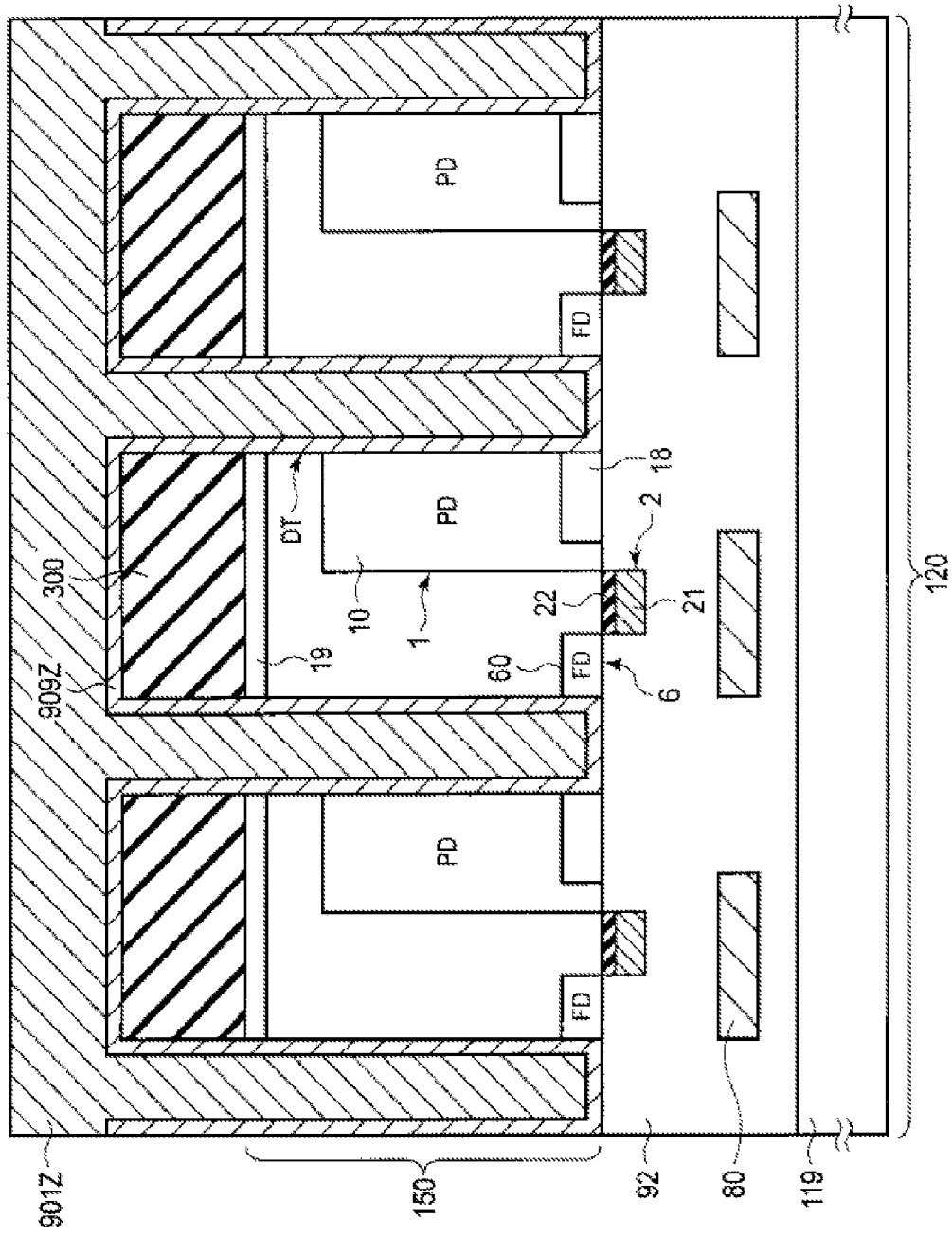
FIG. 6 shows one process of the method of manufacturing the solid state imaging device according to the first embodiment.

As shown in FIG. 6, members (henceforth, element isolation material) 901Z and 909Z to form the element isolating layer are deposited on the semiconductor substrate 150 and the hard mask 300, using the CVD method or the sputter method.

For example, in the case that the element isolating layer 90A includes two members 901Z and 909Z, the first element isolating material (side wall film) 909Z is formed on the lateral sides of the exposed semiconductor substrate 150, so that it does not fill up the trench DTs. Thus, the thickness of the formed first element isolating material 909Z is, for example, smaller than one half of the dimension (width) of the trench DT in the direction parallel to the principle surface of the semiconductor substrate 150. The element isolating material 909Z may be formed by oxidation treatment on the semiconductor substrate 150 or may be formed by a film deposition technology such as the CVD method/sputter method.

Then, the second element isolating material (embedded material) 901Z is formed on the first element isolating material 909Z so that it fills the trench DT. For example, during deposition of the second element isolating material, the first element isolating material 909Z functions as a barrier film.

If the trench DT reaches the interlayer dielectric film 92, the first element isolating material 909Z formed in the bottom part of the trench covers the exposed part of the interlayer dielectric film 92.

Figure 7:
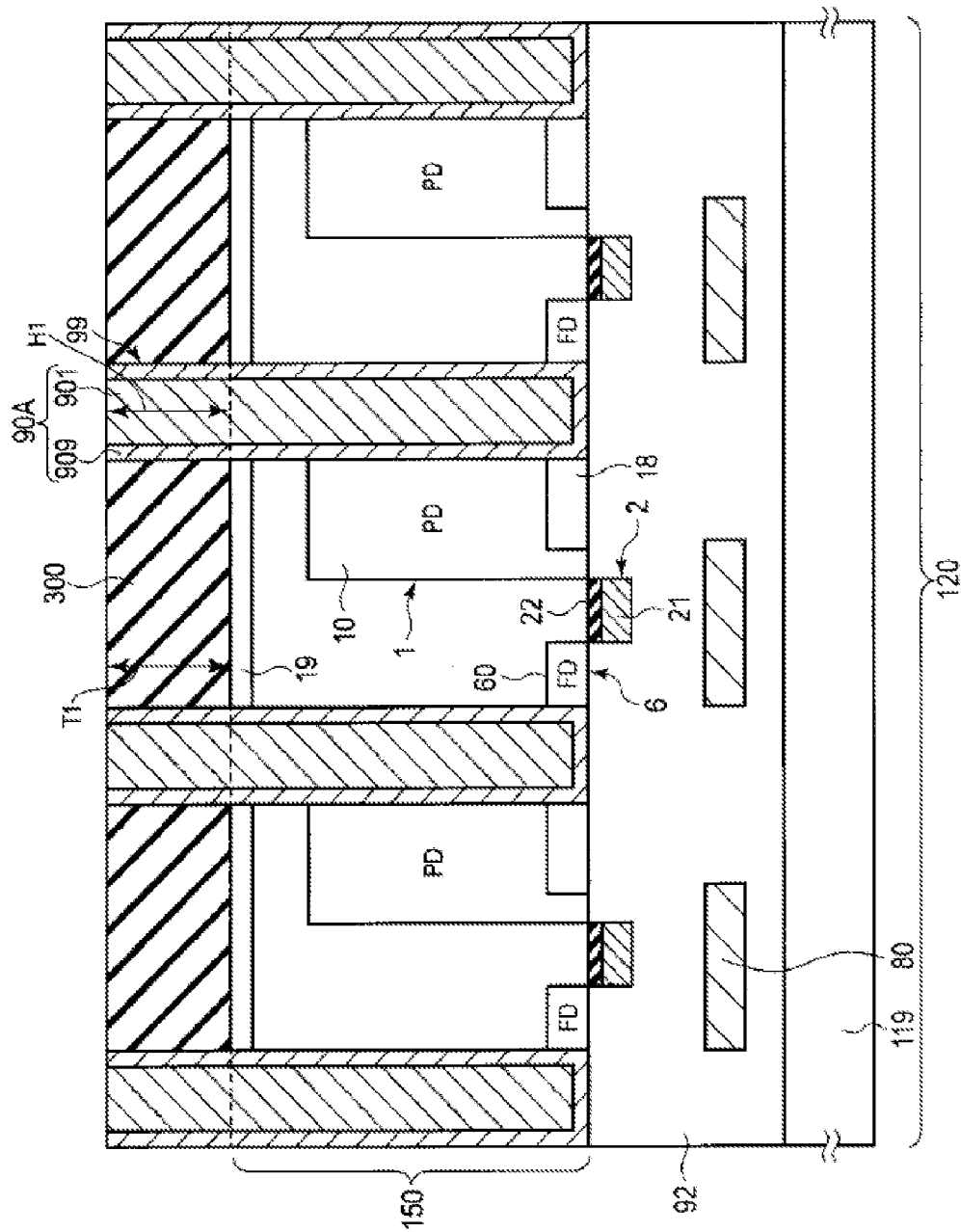
FIG. 7 shows one process of the method of manufacturing the solid state imaging device according to the first embodiment.

Then, CMP is performed to the formed element isolating material 901Z and 909Z, with the hard mask 300 as the stopper. Thus, as shown in FIG. 7, the element isolating material is ground till the hard mask 300 is exposed. By this process, the element isolating layer 90A with a DTI structure is formed in the pixel array 120. As a result, for example, the surface (upper surface) of the element isolating layer 90A on the side opposite to the interlayer dielectric film 92 side is leveled along with the surface of the hard mask.

The dimension of the element isolating layer 90A in the direction perpendicular to the principle surface of the semiconductor substrate is larger than the depth of the formed trench DT.

The element isolating layer 90A is formed so that it has a projecting part 99 that projects out from the rear surface of the semiconductor substrate 150.

In the case that the element isolating material is processed by CMP using the hard mask 300 as the stopper, the dimension H1 of the projecting part 99 of the element isolating layer 90A in the direction perpendicular to the principle surface of the semiconductor substrate 150 is set to be substantially the same as the thickness of the hard mask 300. Thus, by adjusting the thickness of the hard mask 300, the dimension H1 of the projecting part 99 of the element isolating layer 90A can be adjusted.

In this way, an element isolating layer 90A possessing the projecting part 99 is formed in the element isolating region 9 of the pixel array 120.

The hard mask 300 is removed after an element isolating layer 90A with a DTI structure is formed.

Figure 8:
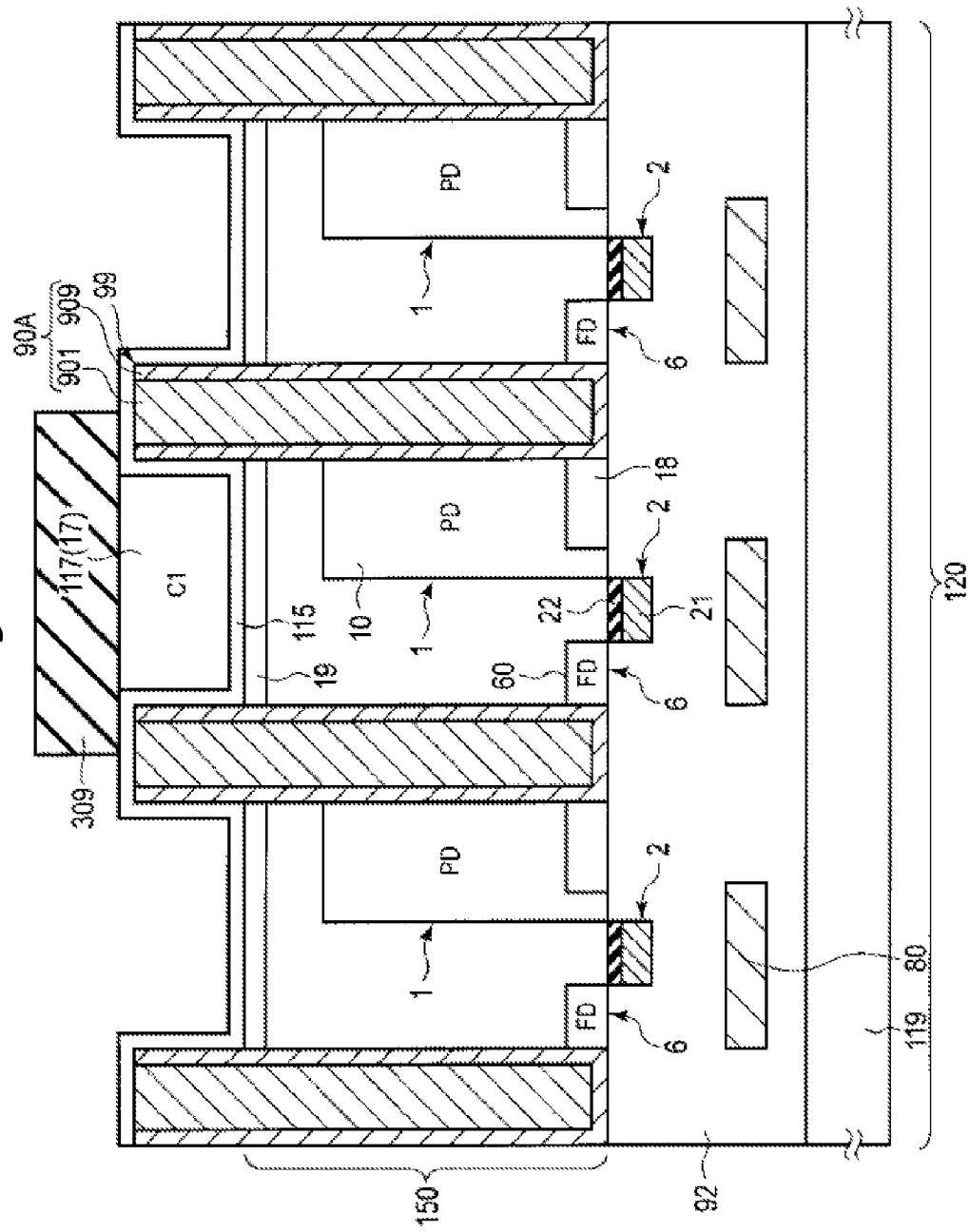
FIG. 8 shows one process of the method of manufacturing the solid state imaging device according to the first embodiment.

As shown in FIG. 8, after the hard mask is removed, the antireflective film 115 is formed on both the rear surface of the semiconductor substrate 150 and the element isolating layer 90A.

The pigmented films 17 of colors C1, C2, and are formed sequentially based on the array pattern set in the color filter 117.

For example, a green pigmented film 17 is deposited on the rear surface of the semiconductor substrate 150 across the entire pixel array 120, using, for example, the coating method or the CVD method. The pigmented film 17 is processed by CMP or etch back, and is filled between the projecting parts 99 of the element isolating layer 90A.

A mask 309 possessing a pattern corresponding to the color array pattern of the green is formed on the green pigmented films 17.

The mask 309 is patterned so that it overlaps with the upper surface of the projecting part of the element isolating layer 90A.

Based on the mask 309 corresponding to the color array pattern of the green, the green pigmented film 17 is retained in the set unit cell region (pixel region) surrounded by the element isolating layer 90A. Also, the green pigmented film in the pixel array 120 is processed so that it is removed from the unit cell region and the pixel region corresponding to the red and blue pigmented films.

In the region surrounded by the element isolating layer 90A, the pigmented film is formed in a self-aligning fashion in the space surrounded by the projecting parts 99 of the element isolating layer 90A. As a result, alignment shift between the photodiode and the pigmented occurs is less likely to occur.

After the green pigmented film 17 is formed in the position corresponding to the set array pattern of the color filter, the red and blue pigmented films 17 are sequentially formed in the position of the set unit cell region (pixel region) corresponding to the array pattern of the color filter 117. Based on the array pattern set for the color filter, such as Bayer pattern, the color filter 117 is formed so that pigmented films 17 having different colors are adjacent.

In addition, the antireflective film formed on the upper end of the element isolating layer 90A may be removed by CMP or etching on the pigmented film 17 during the processing of the pigmented film 17. In this case, the upper end of the element isolating layer 90A is exposed and the antireflective film 115 remains between the pigmented film 17 and the element isolating layer 90A as well as between the pigmented film 17 and the semiconductor substrate 150.

An insulating film (not shown in the figure) is formed as a protective film on the color filter 117.

The wires, pad, or the metal light shielding layer on the rear surface side of the semiconductor substrate 150 can be formed either before or after the color filter 117 may be formed. For example, a metal film is deposited on the insulating film 95 by the sputtering method. The deposited metal film is patterned into a predetermined shape by photolithography and the RIE method. The patterned metal film constitutes the wires, pad 89 and the metal light shielding layer on the rear surface of the semiconductor substrate 150.

For example, after the color filter 117 is formed, as shown in FIG. 2, the through hole via 88A may be embedded in the through hole formed in the semiconductor substrate 150.

The through hole via 88A can be formed before the color filter 117 is formed. The through hole, in which the through hole via 88A is embedded, can be formed in the semiconductor substrate 150 during which the trench DT, in which the element isolating layer 90A in the pixel array 120 is embedded, is formed. If the element isolating layer 90A is a conductive body, the through hole via 88A can be formed using the same material as the element isolating layer 90A.

In this embodiment, the packaging and the modularization of the image sensor is conducted without forming a micro-lens array on the color filter 117.

As describe above, the image sensor of the present embodiment is formed.

According to the manufacturing method of the image sensor of the present embodiment, the element isolating layer 90A with a DTI structure is formed in the element isolating region 9 of the pixel array 120 so as to partition the unit cell region (and the pixel region). Further, in the present embodiment, an element isolating layer 90A having the projecting part 99A that projects out from the rear surface of the semiconductor substrate 150 is formed in the semiconductor substrate 150.

The pigmented films 17 of each color C1, C2, and C3 included in the color filter 117 are sequentially embedded in spaces surrounded by the projecting part 99A of the element isolating layer 90, resulting in an array pattern.

For this reason, the occurrence of alignment shift of the photodiode 1 and the pigmented film 17 of the color filter 117 can be mostly prevented and the color mixture caused by the alignment shift of the pixels (unit cell) and the pigmented film 17 can be suppressed.

In the present embodiment, a micro-lens array is not formed on the color filter 117. For this reason, degradation in the image quality caused by variability in the shape and/or characteristics of each micro-lens can be reduced.

Thus, according to the solid state imaging device of the first embodiment and a manufacturing method of the same, improving image quality can improve.

Second Embodiment

The solid state imaging device (for example, an image sensor) according to the second embodiment is described below with reference to FIG. 9. Descriptions regarding the same effective composition as the composition stated in the first embodiment will be provided if necessary.

Figure 9:
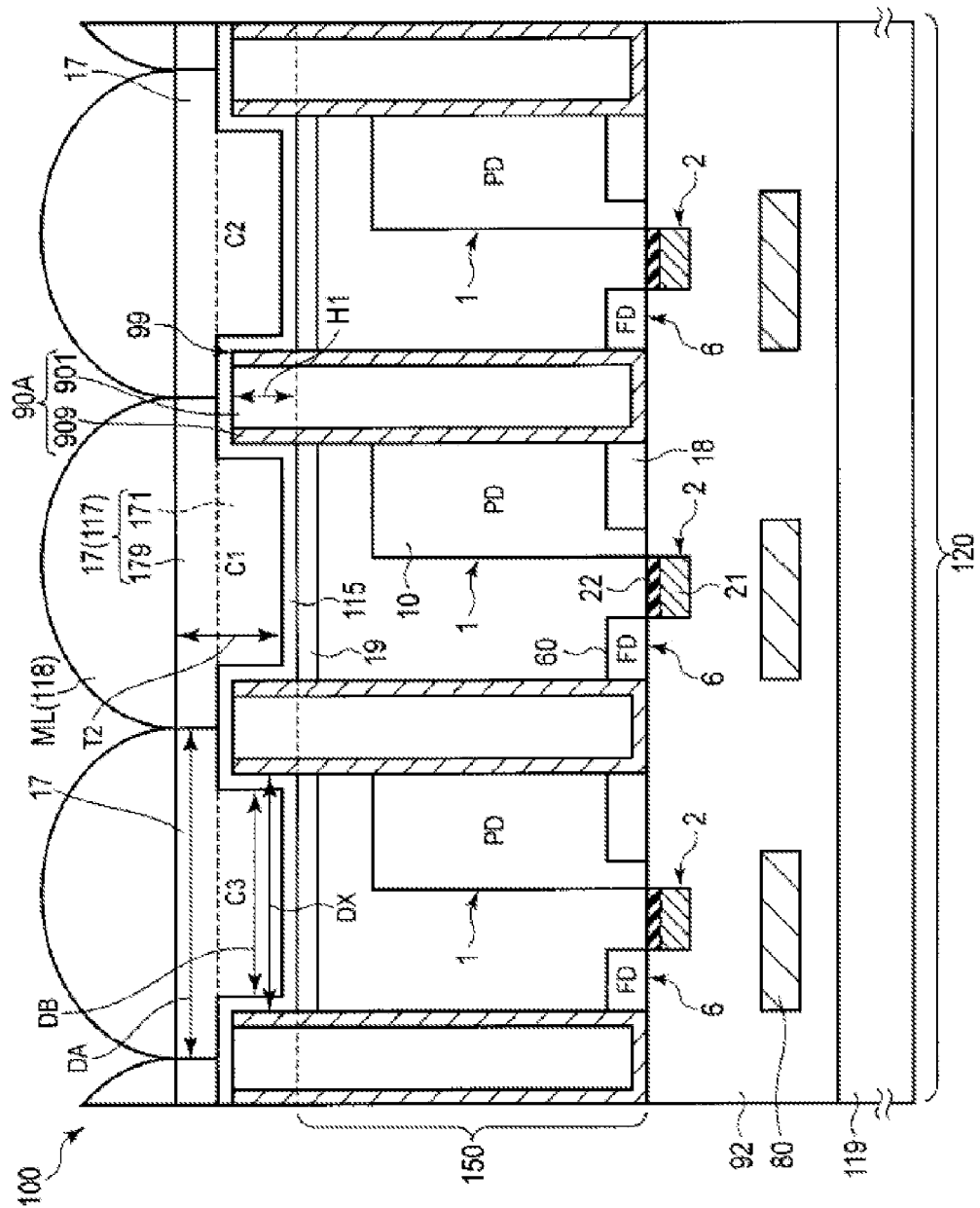
FIG. 9 is a cross-sectional diagram showing one example of the structure of a solid state imaging device according to a second embodiment.

FIG. 9 is a cross-sectional schematic diagram showing the cross-sectional structure of the image sensor of the present embodiment. In FIG. 9, as with FIG. 4, the diagrammatic representation of the interlayer dielectric film, wires, and the support substrate on the front surface of the semiconductor substrate are simplified.

In the image sensor 100 of the present embodiment, each of the pigmented films 17 of the color filter 117 has a part (third part) 171 surrounded by the projecting parts 99 of the element isolating layer 90A and a part (fourth part) 179 that is formed on the part 171 and at the light-incident side (opposite side of the semiconductor substrate 150) of part 171.

To clarify the descriptions of two parts 171 and 179 included in each pigmented film 17, the part 171 is called the lower layer part 171, and the part 179 is called the upper layer part 179 hereinafter.

The upper layer part 179 of the pigmented film 17 is formed above the upper end (upper side, the side opposite to the semiconductor substrate side) of the element isolating layer 90A. For example, two pigmented films 17 with different colors is formed above the upper end of the element isolating layer 90A, and two pigmented films 17 may be in contact with each other above the element isolating layer 90A.

In the present embodiment, the dimension (height) H1 of the projecting part 99 of the element isolating layer 90A is smaller than a thickness T2 of the pigmented film 17. If the thickness T2 of the pigmented film is, for example, around 0.6 μm to 0.7 μm, the dimension H1 of the projecting part 99 is smaller than 0.6 μm to 0.7 μm. The dimension of the projecting part 90A is, for example, around 0.2 μm.

The dimension (width or length) DA of the upper layer part 179 of the pigmented film 17 in the direction parallel to the principle surface of the semiconductor substrate 150 is larger than a dimension DB of the lower layer part 171 of the pigmented film 17 in the direction parallel to the principle surface of the semiconductor substrate 150. The dimension DB is equal to or smaller than a gap DX between the lateral sides of the projecting parts 99 of the element isolating layer 90A. If an antireflective film 115 is formed between the lower layer part 171 and the projecting part 99, the dimension DB of the lower layer part 171, by the film thickness of the antireflective film 115, is smaller than the gaps DX. Thus, in the present embodiment, each pigmented film 17 has a convex cross-sectional shape projecting out to the semiconductor substrate 150 side.

In the image sensor of the present embodiment, for example, a micro-lens array 118 may be attached above the color filter 117, while a protective layer (not shown in the figure) and an adhesive layer (not shown in the figure) is formed between the micro-lens array 118 and the color filter 117. The micro-lens array 118 is formed in a position corresponding to the pixel array 120 in the direction perpendicular to the principle surface of the semiconductor substrate 150. The micro-lens array 117 is formed by arranging a plurality of micro-lenses in two dimensions.

Micro-lenses MLs are formed so that each micro-lens corresponds to the photodiode 1 of each unit cell UC, and one micro-lens ML is formed on each pigmented film 17. The micro-lens concentrates light from the subject to the photodiode 1.

The micro-lenses ML installed per one unit cell (pixel) improves the light concentration property. Also, as shown in FIG. 9, each pigmented film 17 has a part (upper layer part) 179 not divided by the element isolating layer 90A (i.e., contact with each other). Even if the parts 179 of each pigmented film 17 are in contact with each other, the leakage of light to a pigmented film 17 from adjacent pigmented films 17 is reduced, because the micro-lenses ML concentrates the light.

For example, according to the manufacturing method of the image sensor according to the present embodiment, as illustrated in FIG. 8, CMP performed on the pigmented film 17 in order to expose the element isolating layer 90A in the first embodiment is not executed. A mask 309 is formed on the pigmented film without performing the CMP process, and the pigmented film is processed based on the mask 309. With this, as shown in FIG. 9, a pigmented film 173 having a lower layer part 171 and an upper layer part 179 is formed.

As with the first embodiment, in the image sensor of the present embodiment, the spaces surrounded by the projecting part 99 of the element isolating layer 90A, which partitions each unit cell region (pixel region), are filled with a pigmented film 17 of one color. Thus, color mixing caused by the leakage of light in the unit cells and between the pixels having different colors C1, C2, and C3 allocated to them, is prevented.

In the image sensor 100 of the present embodiment, the area (length and width) of the upper layer part 179 of the pigmented film 17, in the direction of illumination (perpendicular to the principle surface of the semiconductor substrate 150) of light from the subject, is larger than the area of the lower layer part 171 of the pigmented film 17 surrounded by the element isolating layer 90A.

For this reason, an opening area of the light-receiving surface of the photodiode 1 (unit cell and pixel) contributing to the acquisition of the light for each color is larger than the configuration with only the lower layer part 171 of the pigmented film 17. Because a region effective (for example the upper region of the element isolating layer) for receiving light from the subject is larger, the amount of light received in the photodiode 1 from each pigmented film 17 can be increased. Thus, the color tones of the images based on light acquired by the image sensor improve.

Thus, like the image sensor of the first embodiment, the image sensor of the second embodiment can improve the quality of the image formed by the image sensor.

Modified Embodiment

A variant example of the solid state imaging device of the embodiment is described below with reference to FIGS. 10 and 11.

Descriptions regarding the same effective configuration as the configuration described in the first and second embodiments will be conducted if necessary. Also, in FIGS. 10 and 11, figures of the interlayer dielectric film, the wires, and the support substrate, on the front surface of the semiconductor substrate, are simplified.

Figure 10:
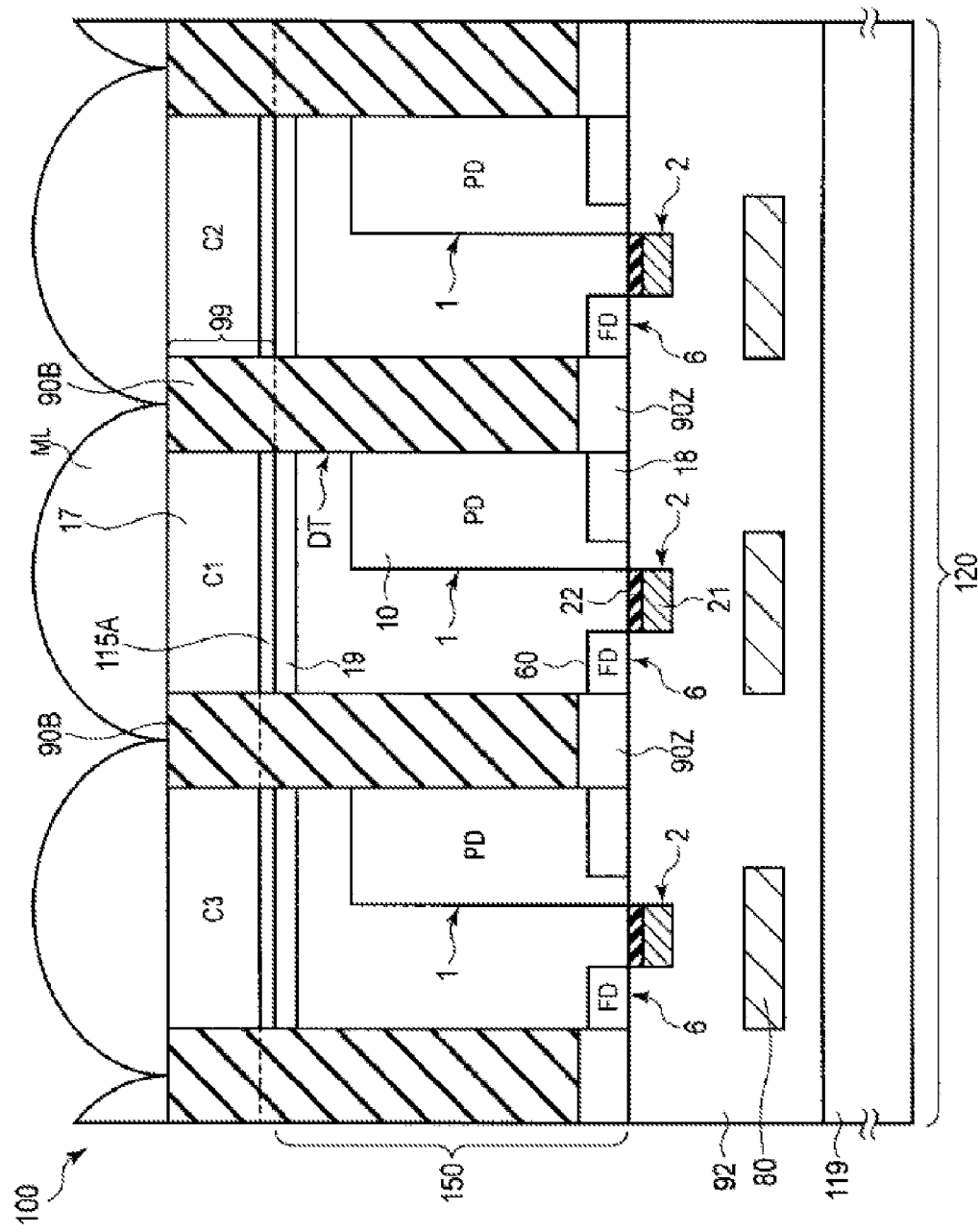
FIG. 10 is a cross-sectional diagram showing a variant example of the solid state imaging device according to one or more embodiments.

FIG. 10 shows one variant example of an image sensor according to the present embodiment.

As shown in FIG. 10, like the first embodiment, on the light receiving side, the surface of the pigmented film 17 and the surface of the upper end of the element isolating layer 90B are flat (do not have steps).

The micro-lens 118 may be formed on the pigmented film 17 and the element isolating layer 90B. If the variability in the characteristics of the micro-lenses ML in the micro-lens array 118 is small, the light concentration property of each of the unit cells UC and the photodiode 1 is improved by the micro-lenses ML, and the amount of light entering the photodiode 1 can be increased.

The antireflective film 115A may be formed on the rear surface of the semiconductor substrate 150 before the trench DT, in which the element isolating layer 90B with a DTI structure is embedded, is formed.

In this case, as shown in FIG. 10, an antireflective film 115A is formed between each pigmented film 17 and the rear surface of the semiconductor substrate 150, and is not formed on the projecting part 99 of the element isolating layer 90B. Thus, the antireflective film 115A is not contiguous in the pixel array 120, and is separated per each unit cell region (or pixel region) by the element isolating layer 90B.

As shown in FIG. 10, the element isolating layer 90B having projecting parts 99 may be a single layer structure made from one material. The element isolating layer 90B with a single layer structure is formed, for example, from oxides such as $SiO_2$ or HfO. The element isolating layer 90B with a single layer structure may be formed using a conductive body (e.g., metal) or a nitride.

Also, as mentioned above, if the element isolating layer 90B with a DTI structure does not penetrate the semiconductor substrate 150, as shown in FIG. 10, element isolating layers 90Z are formed between the element isolating layers 90B and the interlayer dielectric film 92, at the front surface of the semiconductor substrate 150. The element isolating layer 90Z may be formed, for example, from a doped semiconductor or an insulating body. The element isolating layer 90Z can be a semiconductor of the same conducting type and the same dopant concentration as the semiconductor substrate 150. The element isolating layer 90Z formed from an insulating body can also have an STI structure. The element isolating layer 90Z can be formed from the same material as the element isolating layer 90B having a DTI structure. The dimension of the element isolating layer 90Z in the direction perpendicular to the principle surface of the semiconductor substrate 150 is smaller than the dimension of the element isolating layer 90B in the direction perpendicular to the principle surface of the semiconductor substrate 150.

Figure 11:
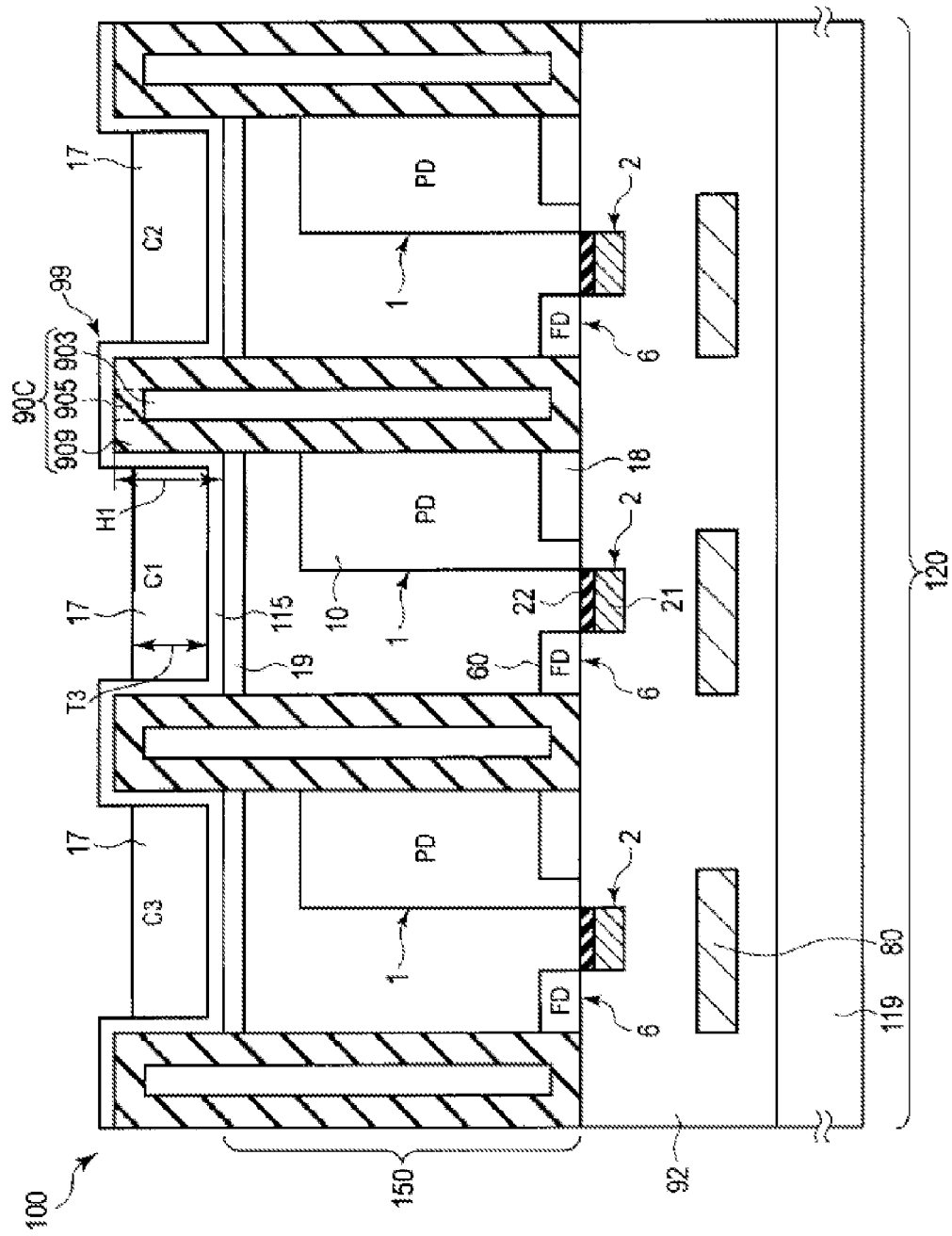
FIG. 11 is a cross-sectional diagram showing another variant example of the solid state imaging device according to one or more embodiments.

FIG. 11 shows another variant example of an image sensor of the present embodiment, which is different that shown in FIG. 10.

As shown in FIG. 11, the inside of an element isolating layer 90C, which has the projecting part 99, can be a cavity.

Inside the trench 90C, sidewall films 909 of the element isolating layer 90C are formed on the exposed surface (the internal surface of the trench) of the semiconductor substrate 150. The sidewall film 909 can be an insulating body such as $SiO_2$ or a conductive body such as TiN. The upper end (the illumination surface side of the light from the subject) of the element isolating layer 90C having the cavity is closed by a part (blocked part) 905. The blocked part 905 can be a material contiguous with the sidewall film 909, or it can be a material different from the sidewall 909. In the case that the blocked part 905 uses a material different from the sidewall film 909, a material that is poorly embedded or has poor coverage (high viscosity) is preferably used for the blocked part 905.

The cavity of the element isolating layer 90C may be filled with, for example, inactive gas such as argon (Ar) or a gas including oxygen, nitrogen, or carbon. The cavity of the element isolating layer 90C can be a vacuum.

As shown in FIG. 11, the upper surface of the pigmented film 17 can be set back to the semiconductor substrate 150 side from the upper end of 90C. In this case, a film thickness T3 of the pigmented film 17 is smaller than the dimension (height) H1 of the projecting part 99 of the element isolating layer 90C.

Even in the variant examples shown in FIG. 10 and FIG. 11 essentially the same effect as the first and the second embodiments can be achieved.

Applied Example

An example of an application of the solid state imaging device of the embodiments is described below with reference to FIG. 12.

The solid state imaging device (image sensor) of the embodiments can be modularized and applied to digital cameras and cell phones having a camera function.

Figure 12:
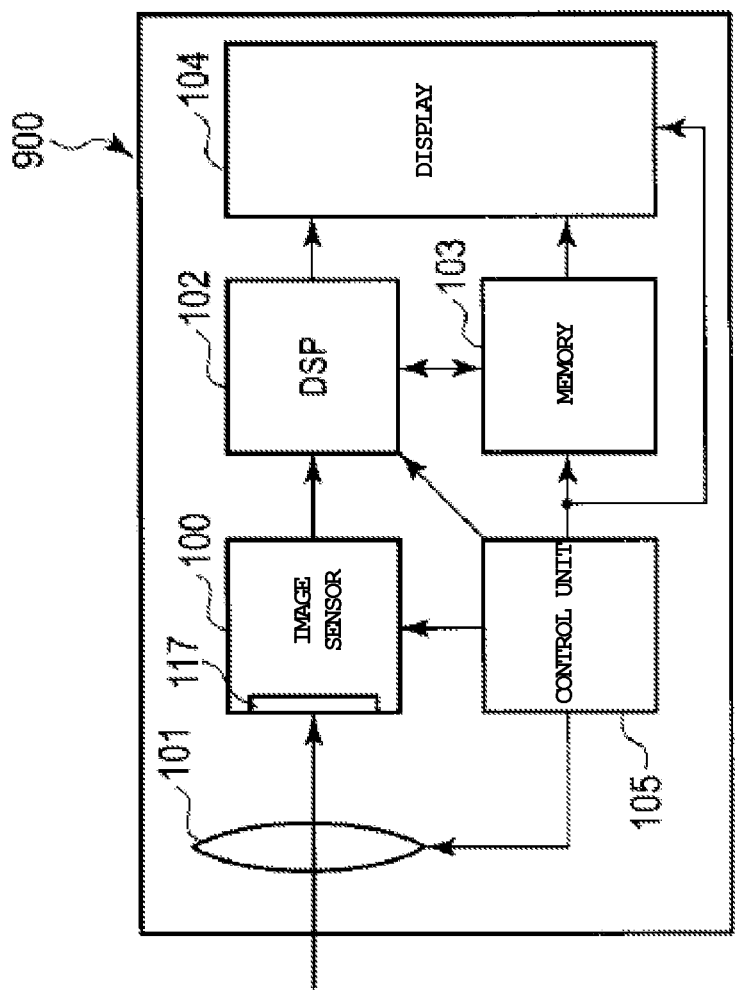
FIG. 12 shows an example of an application of the solid state imaging device of one of the embodiments.

FIG. 12 is a block diagram showing an example of an application of the image sensor of the present embodiment.

A camera (or a cell phone having a camera function) 900 including the image sensor 100 of the present embodiment includes, in addition to the image sensor 100, for example, an optical lens unit (lens unit) 101, a signal processing unit (for example a DSP: Digital Signal Processor) 102, a memory unit (memory) 103, a display unit (display) 104, and a control unit (controller) 105.

The image sensor 100, as mentioned above, converts the light from the subject to electric signals.

The lens unit 101 concentrates light from the subject to the image sensor 100, and provides an image corresponding to light from the subject on the image sensor 100. The lens unit 101 includes multiple lenses, and with each lens, the optical characteristics (for example, focal length) of the lens unit 101 can be controlled mechanically or electronically.

The DSP 102 processes signals output from the image sensor 100. The DSP 102, based on signals from the image sensor 100, forms an image (image data) corresponding to the subject.

The memory 103 stores image data provided from the DSP 102. The memory 103 can also store externally provided signals and data, or signals and data provided directly from the image sensor. The memory 103 can be a memory chip such as DRAM and flash memory integrated with the camera 900, or a memory card or USB memory removable from the camera 900.

The display 104 displays the image data from the DSP 102 and the memory 103. The data from the DSP 102 or the memory 103 may be still image data or video data.

The controller 105 controls the behavior of each component 100 through 104 in the camera 900.

If the image sensor 100 of the first embodiment, in which a micro-lens array (on-chip lens) on the color filter 117 is not included is used for a camera module, the camera module does not have a micro-lens array between the lens unit 101 and the color filter formed on the chip of the image sensor 100.

Thus, as shown in FIG. 12, if the camera (and the camera module) 900 includes the image sensor of the first embodiment, the light from the lens unit 101 may directly illuminate the color filter 117 of the image sensor 100.

Furthermore, image sensors described in the second embodiment and the variant examples can also be applied to the camera.

Thus, the image sensor of the present embodiments can be applied to the camera 900. The camera 900 including the image sensor 100 of the present embodiments can improve the quality of the image formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state imaging device comprising:
 a semiconductor substrate having an element isolating layer and a plurality of photoelectric conversion elements each formed in a respective one of a plurality of pixel regions that are isolated from each other by the element isolating layer;
 an interlayer dielectric layer that has wires and is formed on a first surface of the semiconductor substrate; and
 a color filter layer having pigmented films of a plurality of colors, which are formed on a second surface of the semiconductor substrate that is opposite to the first surface,
 wherein the element isolating layer has a part projecting from the second surface, and
 wherein at least part of the pigmented films is formed in a space defined by the second surface and the projecting part of the element isolating layer.

2. The solid state imaging device according to claim 1, wherein
 a dimension of the projecting part in a direction perpendicular to the second surface is smaller than a dimension of the pigmented film in a direction perpendicular to the second surface.

3. The solid state imaging device according to claim 1, wherein the pigmented films each include,
 a lower part formed in the space that is formed by the second surface of the semiconductor substrate and the projecting part of the element isolating layer, and
 an upper part formed on the lower part and above the element isolating layer.

4. The solid state imaging device according to claim 1, further comprising:
 a plurality of micro-lenses each formed above the color filter for a respective one of the photoelectric conversion elements.

5. The solid state imaging device according to claim 1, wherein
 the element isolating layer comprises a peripheral part that is in contact with the semiconductor substrate and an inner part that is separated from the semiconductor substrate by the peripheral part, and
 the material of the peripheral part is different from the material of the inner part.

6. The solid state imaging device according to claim 5, wherein the peripheral part is comprised of titanium nitride.

7. The solid state imaging device according to claim 5, wherein
 the inner part is comprised of an electrically conductive material.

8. The solid state imaging device according to claim 1, wherein
 the element isolating layer comprises a lower part that is in contact with the interlayer dielectric layer and an upper part that is formed on the lower part, and
 the lower part is comprised of a doped semiconductor or an insulating material.

9. The solid state imaging device according to claim 1, wherein
 the element isolating layer has a cavity therein.

10. The solid state imaging device according to claim 1 implemented in a camera as an image sensor that converts light from a subject to electric signals, the camera including:
 a lens unit that concentrates the light from the subject to the image sensor;
 a signal processing unit that processes signals output from the image sensor;
 a memory unit that stores image data provided from the signal processing unit;
 a display unit that displays the image data from the signal processing unit and the memory unit; and a control unit that controls the behavior of the image sensor, the lens unit, the signal processing unit, the memory unit, and the display unit.

11. A solid state imaging device comprising:
a semiconductor substrate having an element isolating layer and a plurality of photoelectric conversion elements each formed in a respective one of a plurality of pixel regions that are isolated from each other by the element isolating layer;
an interlayer dielectric layer that has wires and is formed on a first surface of the semiconductor substrate; and
a color filter layer having pigmented films of a plurality of colors, which are formed on a second surface of the semiconductor substrate that is opposite to the first surface,
wherein the element isolating layer has a projecting part that extends above the second surface of the semiconductor surface, and a dimension of the projecting part in a direction perpendicular to the second surface is smaller than a dimension of the pigmented films in the direction perpendicular to the second surface.

12. The solid state imaging device according to claim 11, wherein the pigmented films each include,
a lower part formed in the space that is formed by the second surface of the semiconductor substrate and the projecting part of the element isolating layer, and
an upper part formed on the lower part and above the element isolating layer.

13. The solid state imaging device according to claim 11, further comprising:
a plurality of micro-lenses each formed above the color filter for a respective one of the photoelectric conversion elements.

14. The solid state imaging device according to claim 11, wherein
the element isolating layer comprises a peripheral part that is in contact with the semiconductor substrate and an inner part that is separated from the semiconductor substrate by the peripheral part, and
the material of the peripheral part is different from the material of the inner part.

15. The solid state imaging device according to claim 11, wherein
the element isolating layer comprises a lower part that is in contact with the interlayer dielectric layer and an upper part that is formed on the lower part, and
the lower part is comprised of a doped semiconductor or an insulating material.

* * * * *